US012652054B1

(12) United States Patent
Meruva et al.

(10) Patent No.: US 12,652,054 B1
(45) Date of Patent: Jun. 9, 2026

(54) CURRENT STARVED DELAY LINE BANDWIDTH ACROSS PROCESS CORNERS

(71) Applicant: QUALCOMM Incorporated, San Diego, CA (US)

(72) Inventors: Anand Meruva, San Diego, CA (US); Prince Mathew, San Diego, CA (US); Jeffrey Mark Hinrichs, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 23 days.

(21) Appl. No.: 18/970,565

(22) Filed: Dec. 5, 2024

(51) Int. Cl.
*H03L 7/081* (2006.01)
(52) U.S. Cl.
CPC .................................. *H03L 7/0818* (2013.01)
(58) Field of Classification Search
CPC .................................................... H03L 7/0818
USPC ............................................................ 327/158
See application file for complete search history.

(56) References Cited

U.S. PATENT DOCUMENTS

| | | | | |
|---|---|---|---|---|
| 5,463,337 A * | 10/1995 | Leonowich | ........... | H03L 7/0816 |
| | | | | 327/158 |
| 7,221,202 B1 * | 5/2007 | Yayla | .................... | H03L 7/0816 |
| | | | | 327/158 |
| 7,664,216 B2 * | 2/2010 | Schnarr | ................ | G11C 7/1066 |
| | | | | 375/376 |
| 7,671,634 B2 * | 3/2010 | McCoy | ............... | G06F 11/1604 |
| | | | | 327/407 |

| | | | | |
|---|---|---|---|---|
| 9,584,105 B1 * | 2/2017 | Foley | .................... | H03L 7/0816 |
| 11,171,654 B1 * | 11/2021 | Hinrichs | .............. | H03L 7/0805 |
| 11,916,558 B1 * | 2/2024 | Xu | .......................... | H03L 7/0812 |
| 12,095,467 B2 * | 9/2024 | Meruva | ................. | H03L 7/0818 |
| 2009/0322392 A1 | 12/2009 | Miyamoto | | |
| 2011/0074477 A1 * | 3/2011 | Nagarajan | ............. | H03L 7/0814 |
| | | | | 327/158 |
| 2014/0002155 A1 * | 1/2014 | Park | ........................ | H03L 7/087 |
| | | | | 327/158 |
| 2017/0207779 A1 * | 7/2017 | Chen | ........................ | H03L 7/099 |
| 2017/0338825 A1 * | 11/2017 | Lee | .......................... | H03L 7/10 |

(Continued)

OTHER PUBLICATIONS

Agrawal A., et al., "Area Efficient Phase Calibration of a 1.6 GHz Multiphase DLL", Custom Integrated Circuits Conference (CICC), 2011 IEEE, IEEE, Sep. 19, 2011, 4 Pages, XP032063793, paragraph [0001]—paragraph [00IV], figures 1-9.

(Continued)

*Primary Examiner* — Ryan Jager
(74) *Attorney, Agent, or Firm* — Loza & Loza, LLP

(57) ABSTRACT

A delay locked loop (DLL) includes a phase detector having a first input, a second input, and an output, and a first delay path coupled between an input of the DLL and the first input of the phase detector, wherein the first delay path includes a first delay circuit. The first delay circuit includes first delay buffers coupled in series and load capacitors, wherein each of the load capacitors is coupled to an output of a respective one of the first delay buffers. The DLL also includes a second delay path coupled between the input of the DLL and the second input of the phase detector, wherein the second delay path includes a one-cycle delay circuit and a second delay circuit coupled in series. The DLL also includes a control circuit coupled to the output of the phase detector, the first delay circuit, and the second delay circuit.

20 Claims, 12 Drawing Sheets

(56) References Cited

U.S. PATENT DOCUMENTS

| 2024/0146313 A1* | 5/2024 | Meruva | H03L 7/0814 |
| 2024/0161808 A1* | 5/2024 | Xu | G11C 11/4076 |

OTHER PUBLICATIONS

International Search Report and Written Opinion—PCT/US2025/055937—ISA/EPO—Mar. 16, 2026.
She X., et al., "Tunable SEU-Tolerant Latch", IEEE Transactions on Nuclear Science, IEEE, USA, vol. 57, No. 6, Dec. 1, 2010, pp. 3787-3794, XP011339755, paragraph [0001]—paragraph [000V], figures 1-7.

* cited by examiner clk_in in_1cycle delay clk_del
(x caps on)

clk_del
(x+y caps on)

clk_ref

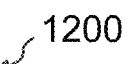

1200

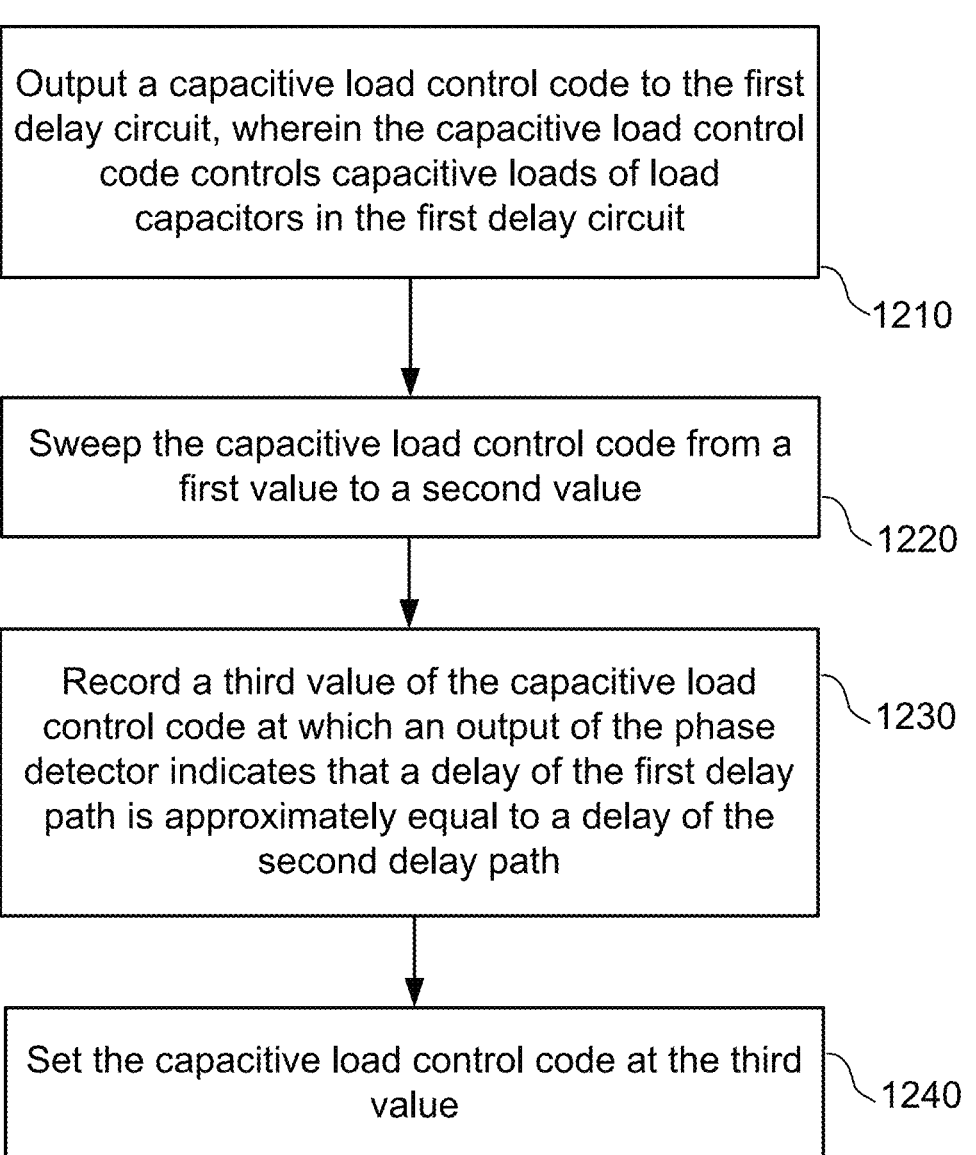

Output a capacitive load control code to the first delay circuit, wherein the capacitive load control code controls capacitive loads of load capacitors in the first delay circuit

1210

Sweep the capacitive load control code from a first value to a second value

1220

Record a third value of the capacitive load control code at which an output of the phase detector indicates that a delay of the first delay path is approximately equal to a delay of the second delay path

1230

Set the capacitive load control code at the third value

CURRENT STARVED DELAY LINE BANDWIDTH ACROSS PROCESS CORNERS

BACKGROUND

Field

Aspects of the present disclosure relate generally to delay, and, more particularly, to current starved delay lines.

Background

A delay circuit may be used to delay a signal by an adjustable (i.e., tunable) delay. The adjustable delay may be used to adjust the timing of a first signal relative to a second signal (e.g., to align the first signal with the second signal or produce a desired phase between the first signal and the second signal). The delay circuit may be implemented with a delay line including multiple cascaded delay buffers (e.g., current starved inverters).

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a delay locked loop (DLL). The DLL includes a phase detector having a first input, a second input, and an output, and a first delay path coupled between an input of the DLL and the first input of the phase detector, wherein the first delay path includes a first delay circuit. The first delay circuit includes first delay buffers coupled in series and load capacitors, wherein each of the load capacitors is coupled to an output of a respective one of the first delay buffers. The DLL also includes a second delay path coupled between the input of the DLL and the second input of the phase detector, wherein the second delay path includes a one-cycle delay circuit and a second delay circuit coupled in series. The DLL also includes a control circuit coupled to the output of the phase detector, the first delay circuit, and the second delay circuit.

A second aspect relates to a method of calibration in a delay locked loop (DLL). The DLL includes a phase detector, a first delay path coupled between an input of the DLL and a first input of the phase detector, and a second delay path coupled between the input of the DLL and a second input of the phase detector. The first delay path includes a first delay circuit, and the second delay path includes a one-cycle delay circuit and a second delay circuit coupled in series. The method includes outputting a capacitive load control code to the first delay circuit, wherein the capacitive load control code controls capacitive loads of load capacitors in the first delay circuit. The method also includes sweeping the capacitive load control code from a first value to a second value, recording a third value of the capacitive load control code at which an output of the phase detector indicates that a delay of the first delay path is approximately equal to a delay of the second delay path, and setting the capacitive load control code at the third value.

BRIEF DESCRIPTION OF THE DRAWINGS

FIG. 12 is a flowchart illustrating a method of calibration in a DLL according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A delay circuit may be used to delay a signal by an adjustable (i.e., tunable) delay. The adjustable delay may be used to adjust the timing of a first signal relative to a second signal (e.g., to align the first signal with the second signal or produce a desired phase between the first signal and the second signal). For example, a delay circuit may be used in a data interface that includes a latch configured to latch data bits from a data signal on edges of a clock signal. In this example, the delay circuit may be used to adjust the timing of the clock signal or the data signal to center the edges of the clock signal between transitions of the data signal. In another example, one or more delay circuits may be used at a data interface that receives multiple data signals in parallel. In this example, the received data signals may be misaligned in time (i.e., skewed) and the one or more delay circuits may be used to adjust the timing of the data signals to realign the data signals. It is to be appreciated that the present disclosure is not limited to the above examples, and that delay circuits may be used in a wide variety of applications to adjust the timing of one or more signals.

Figure 1:
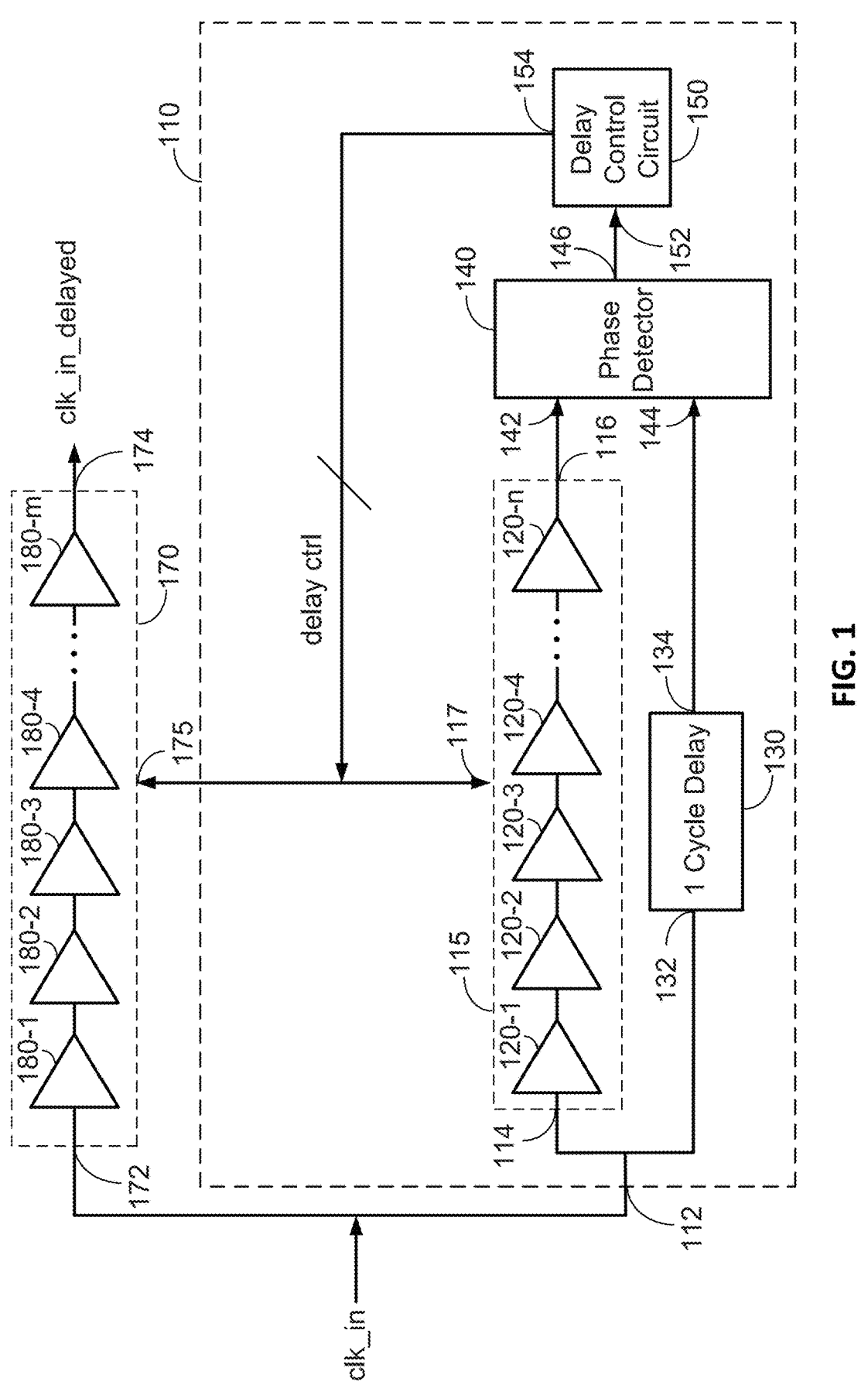
FIG. 1 shows an example of a delay locked loop (DLL) and a delay circuit according to certain aspects of the present disclosure.

The delay of a delay circuit may be controlled by a delay control signal that is generated using a delay locked loop (DLL). In this regard, FIG. 1 shows an example of a DLL 110 that may be used to generate a delay control signal for a delay circuit 170. In this example, the DLL 110 may be referred to as a master DLL and the delay circuit 170 may be referred to as a slave delay circuit. However, it is to be appreciated that the present disclosure is not limited to this terminology.

In the example in FIG. 1, the DLL 110 is configured to receive a clock signal ("clk_in") from a clock source (not shown). As discussed further below, the DLL 110 uses the clock signal as a timing reference to generate the delay control signal for the delay circuit 170.

The DLL 110 includes a delay circuit 115, a one-cycle delay circuit 130, a phase detector 140 (also referred to as a phase frequency detector (PFD)), and a delay control circuit 150. In certain aspects, the delay circuit 115 includes delay buffers 120-1 to 120-$n$ coupled in series (i.e., cascaded delay buffers). In this example, the delay of the delay circuit 115 is approximately equal to the sum of the delays of the delay buffers 120-1 to 120-$n$. A delay buffer may also be referred to as a delay element or another term. In this example, the delay circuit 115 may also be referred to as a delay line since the delay circuit 115 includes multiple cascaded delay buffers in this example. However, it is to be appreciated that the delay circuit 115 is not limited to this example.

The delay circuit 115 has an input 114 and an output 116. The input 114 of the delay circuit 115 is coupled to the input 112 of the DLL 110. The delay circuit 115 is configured to receive the clock signal at the input 114, delay the clock signal by a tunable delay, and output the delayed clock signal at the output 116. The delay circuit 115 also has a control input 117 configured to receive a delay control signal from the delay control circuit 150. As discussed further below, the tunable delay of the delay circuit 115 is controlled by the delay control signal from the delay control circuit 150. The delay control signal may include one or more signals and may be distributed to each of the delay buffers 120-1 to 120-$n$ in the delay circuit 115 to control the delay of each of the delay buffers 120-1 to 120-$n$.

The one-cycle delay circuit 130 has an input 132 and an output 134. The input 132 of the one-cycle delay circuit 130 is coupled to the input 112 of the DLL 110. The one-cycle delay circuit 130 is configured to receive the clock signal at the input 132, delay the clock signal by one cycle (i.e., one period) of the clock signal, and output the one-cycle delayed clock signal at the output 134. For example, the one-cycle delay circuit 130 may include a latch (e.g., flip flop) that is clocked by the clock signal.

The phase detector 140 has a first input 142 coupled to the output 116 of the delay circuit 115, a second input 144 coupled to the output 134 of the one-cycle delay circuit 130, and an output 146. The phase detector 140 is configured to compare the phases of the delayed clock signal from the delay circuit 115 with the one-cycle delayed clock signal, and output an output signal indicating the phase difference (i.e., phase error) between the delayed clock signal from the delay circuit 115 and the one-cycle delayed clock signal. In one example, the phase detector 140 may be implemented with a bang-bang phase detector in which the output signal of the phase detector 140 indicates whether an edge of the delayed clock signal from the delay circuit 115 is late or early with respect to an edge of the one-cycle delayed clock signal (i.e., indicates whether the delay of the delay circuit 115 is longer or shorter than one cycle of the clock signal). It is to be appreciated that the phase detector 140 is not limited to this example.

The delay control circuit 150 has an input 152 coupled to the output 146 of the phase detector 140, and an output 154 coupled to the control input 117 of the delay circuit 115. The delay control circuit 150 is configured to receive the output signal from the phase detector 140 at the input 152, generate the delay control signal based on the received output signal, and output the delay control signal to the delay circuit 115 via the output 154. In certain aspects, the delay control circuit 150 is configured to tune (i.e., adjust) the delay of the delay circuit 115 using the delay control signal until the phase difference between the delayed clock signal from the delay circuit 115 and the one-cycle delayed clock signal indicated by the phase detector 140 is approximately zero. When the phase difference (i.e., phase error) is approximately zero, the delay of the delay circuit 115 is approximately equal to one cycle (i.e., one period) of the clock signal. Thus, in this example, the DLL 110 locks when the delay of the delay circuit 115 is approximately equal to one cycle (i.e., one period) of the clock signal clk_in. The delay of each of the delay buffers 120-1 to 120-$n$ may be approximately equal to T/n where n is the number of the delay buffers 120-1 to 120-$n$ and T is one cycle of the clock signal clk_in.

The delay control signal generated by the delay control circuit 150 may also be sent to the delay circuit 170 to control a tunable delay of the delay circuit 170, as shown in FIG. 1. In this example, the delay circuit 170 has an input 172, an output 174, and a control input 175 coupled to the output 154 of the delay control circuit 150. The input 172 of the delay circuit 170 is configured to receive a signal (e.g., the clock signal clk_in or another signal), delay the signal by the tunable delay of the delay circuit 170 to adjust the timing of the signal, and output the delayed signal at the output 174. In this example, the delay circuit 170 is configured to receive the delay control signal from the delay control circuit 150 at the control input 175, and set the delay of the delay circuit 170 based on the delay control signal. Thus, in this example, the delay of the delay circuit 170 is controlled by the delay control signal generated using the DLL 110.

In the example shown in FIG. 1, the delay circuit 170 includes delay buffers 180-1 to 180-$m$ coupled in series (i.e., cascaded delay buffers). Each of the delay buffers 180-1 to 180-$m$ may have the same or similar structure as each of the delay buffers 120-1 to 120-$n$. The delay control signal from the delay control circuit 150 may be distributed to each of the delay buffers 180-1 to 180-$m$ in the delay circuit 170 to control the delay of each of the delay buffers 180-1 to 180-$m$.

As discussed above, the delay control circuit 150 tunes the delay control signal until the delay of the delay circuit 115 is approximately equal to one cycle (i.e., one period) of the clock signal clk_in. When this occurs, the delay of each of the delay buffers 120-1 to 120-$n$ in the delay circuit 115 is approximately equal to 1/n of a cycle of the clock signal where n is the number of the delay buffers 120-1 to 120-$n$. In this example, the delay control signal may cause the delay of the delay circuit 170 to be approximately equal to m/n times one cycle of the clock signal where m is the number of the delay buffers 180-1 to 180-$m$ in the delay circuit 170.

However, it is to be appreciated that the present disclosure is not limited to this example.

In certain aspects, the delay circuit 170 provides a delay in delay steps of T/n where T/n is the delay of each of the delay buffers 180-1 to 180-m. In one example, a finer delay step may be achieved using delay interpolation. In this example, the outputs of two adjacent delay buffers among the delay buffers 180-1 to 180-m may be selected using a multiplexer (not shown), switches (not shown), or any combination of both. The output signals of the selected two adjacent delay buffers may then be mixed by a phase interpolator to provide a signal having a delay that is between the delays of the two adjacent delay buffers.

Figure 2:
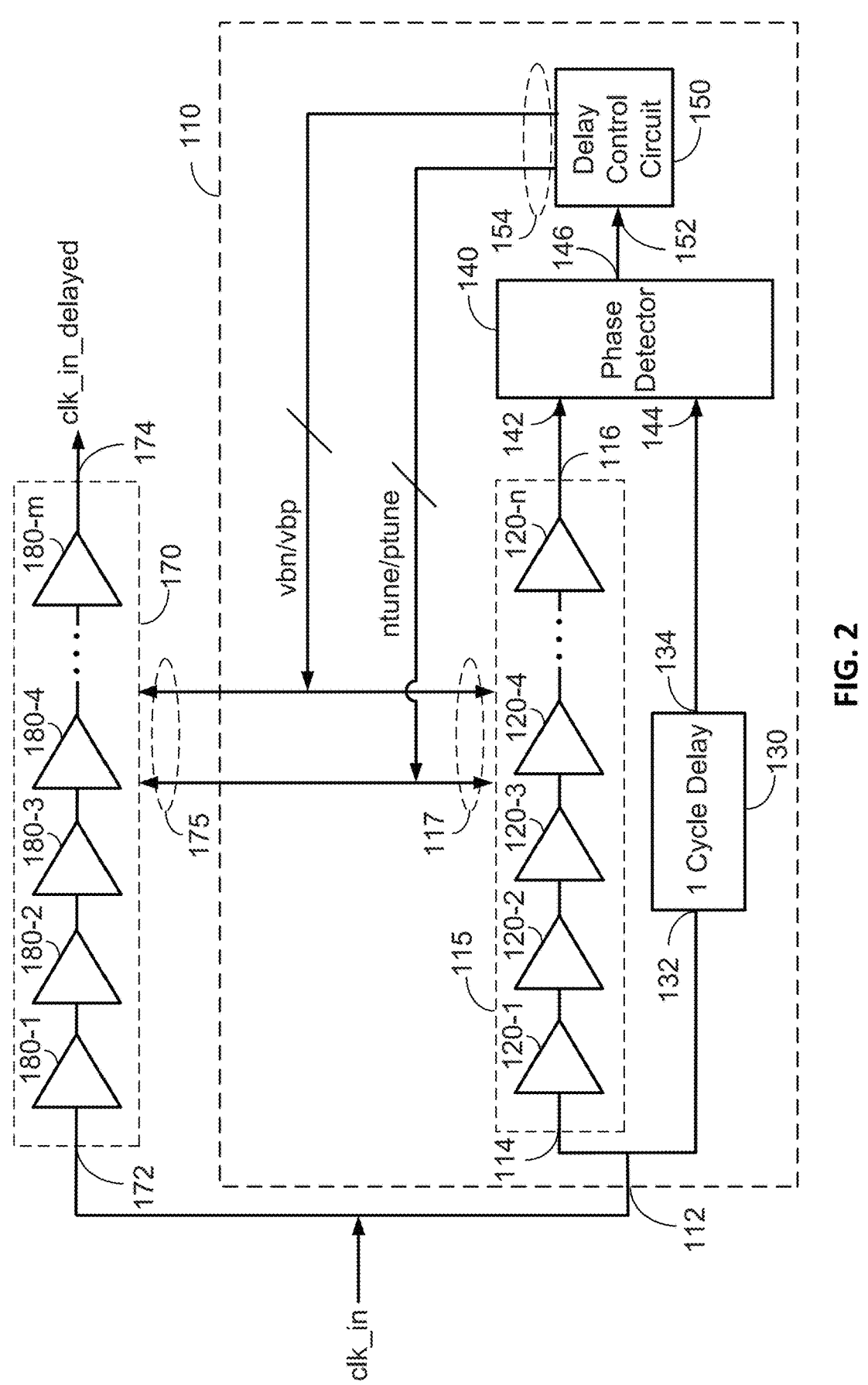
FIG. 2 shows an example of a DLL including current starved delay buffers according to certain aspects of the present disclosure.

FIG. 2 shows an example in which the delay control signal includes a first delay control signal and a second delay control signal. Each of the first and second delay control signals controls the delays of the delay buffers 120-1 to 120-n by controlling the current drive strengths of the delay buffers 120-1 to 120-n. In this example, a higher current drive strength decreases the delay of a delay buffer and a lower current drive strength increases the delay of the delay buffer.

In the example shown in FIG. 2, the first delay signal includes switch control signals ntune/ptune that adjust the current drive strengths of the delay buffers 120-1 to 120-n by controlling the on/off states of switches in the delay buffers 120-1 to 120-n. Also, in this example, the second delay signal includes gate bias voltages vbn/vbp that adjust the current drive strengths of the delay buffers 120-1 to 120-n by controlling gate bias voltages in the delay buffer 120-1 to 120-n. In certain aspects, the delay control circuit 150 may include one or more digital-to-analog converters (DACs) for generating the gate bias voltages vbn/vbp. The switch control signals ntune/ptune and the gate bias voltages vbn/vbp may also be referred to individually or collectively as a current control signal since they control delay by controlling current drive strengths.

Figure 3:
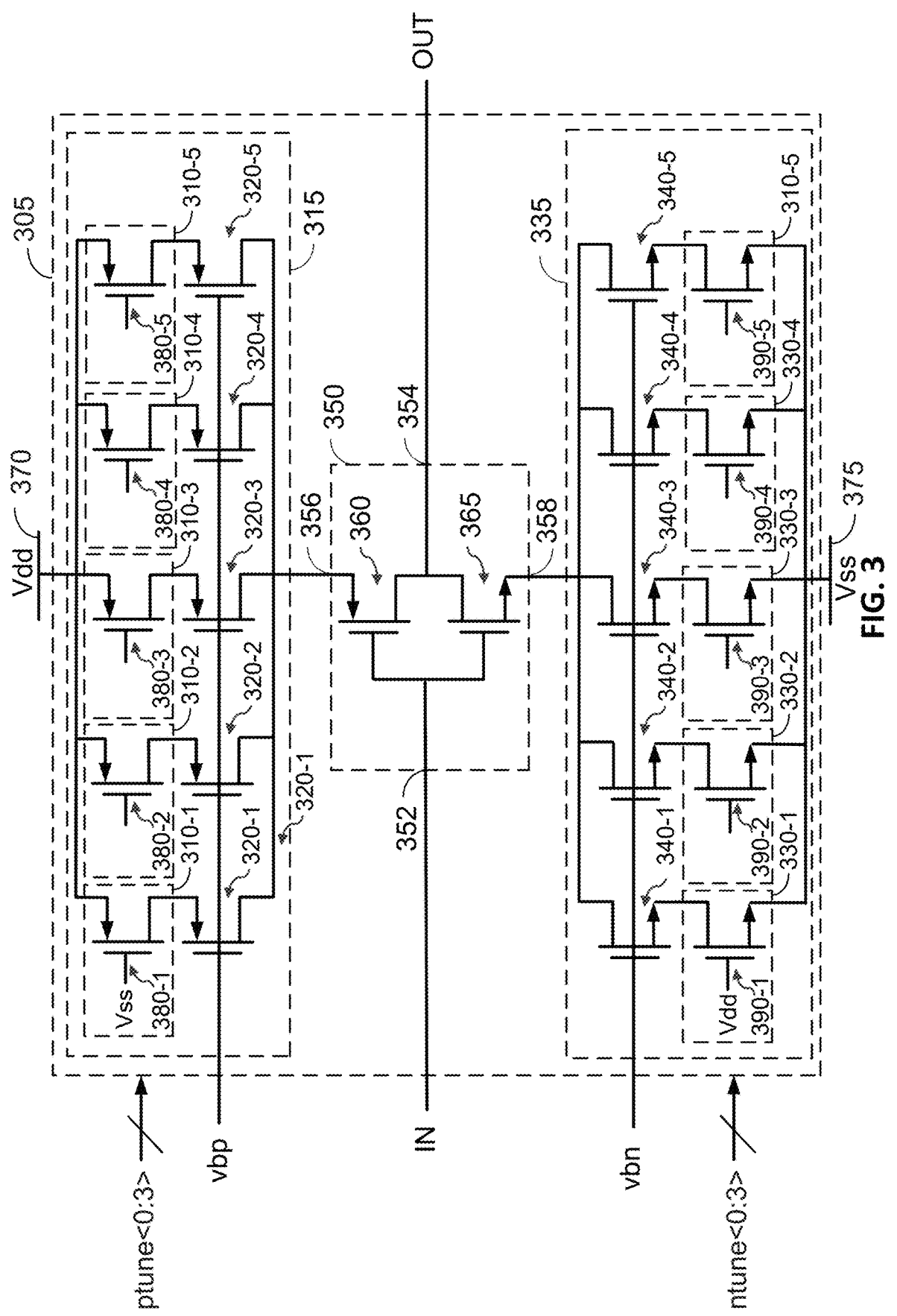
FIG. 3 shows an exemplary implementation of a current starved delay buffer according to certain aspects of the present disclosure.

FIG. 3 shows an exemplary implementation of a current starved delay buffer 305 according to certain aspects. Each of the delay buffers 120-1 to 120-n shown in FIG. 2 may be implemented with a respective instance of the exemplary delay buffer 305. As used herein, a current starved delay buffer is a delay buffer having a delay that is adjusted by adjusting the current drive strength of the delay buffer.

In this example, the delay buffer 305 includes a delay device 350, a first current circuit 315, and a second current circuit 335 according to certain aspects. The delay device 350 has an input 352, an output 354, a first current terminal 356, and a second current terminal 358. The first current circuit 315 and the second current circuit 335 control the current drive strength (and hence the delay) of the delay device 350, as discussed further below.

The delay device 350 is configured to receive the clock signal at the input 352, delay the clock signal by the delay of the delay device 350, and output the delayed clock signal at the output 354. As discussed further below, the delay of the delay device 350 depends on the currents flowing through the current terminals 356 and 358, which are controlled by the current circuits 315 and 335 based on the control signals ntune/ptune and vbn/vbp discussed above.

In the example shown in FIG. 3, the delay device 350 includes an inverter including a p-type transistor 360 (e.g., p-type field effect transistor (PFET)) and an n-type transistor 365 (e.g., n-type field effect transistor (NFET)). In this example, the source of the p-type transistor 360 is coupled to the first current terminal 356, the gate of the p-type transistor 360 is coupled to the input 352, and the drain of the p-type transistor 360 is coupled to the output 354. Also, in this example, the source of the n-type transistor 365 is coupled to the second current terminal 358, the gate of the n-type transistor 365 is coupled to the input 352, and the drain of the n-type transistor 365 is coupled to the output 354. It is to be appreciated that the delay device 350 is not limited to the example of an inverter. It is also to be appreciated that the delay device 350 may include two cascaded inverters in some implementations. In the example shown in FIG. 3, the current starved delay buffer is implemented with a current starved inverter.

In the example shown in FIG. 3, the first current circuit 315 includes a first set of transistors 320-1 to 320-5 and a first set of switches 310-1 to 310-5 according to certain aspects. In this example, each of the transistors 320-1 to 320-5 is coupled in series with a respective one of the switches 310-1 to 310-5 between a supply rail 370 and the first current terminal 356 of the delay device 350. The supply rail 370 has a supply voltage Vdd, which may be provided by a power distribution network. It is to be appreciated that the number of transistors 320-1 to 320-5 and the number of switches 310-1 to 310-5 are not limited to the example shown in FIG. 3. In the example shown in FIG. 3, each of the switches 310-1 to 310-5 is implemented with a respective transistor 380-1 to 380-5 (e.g., respective PFET).

In certain aspects, the transistors 320-1 to 320-5 are binary weighted. For example, the widths (e.g., channel or gate widths) of the transistors 320-1 to 320-5 may be binary weighted, in which the widths of the transistors 320-1 to 320-5 differ from one another by powers of two.

The switches 310-2 to 310-5 are used to select which ones of the transistors 320-2 to 320-5 are enabled or disabled based on the switch control signal ptune which includes a ptune <0:3> code in this example. More particularly, each of the transistors 320-2 to 320-5 is enabled when the respective one of the switches 310-2 to 310-5 is turned on (i.e., closed) and each of the transistors 320-2 to 320-5 is disabled when the respective one of the switches 310-2 to 310-5 is turn off (i.e., opened). In this example, the ptune<0:3> code controls which ones of the transistors 320-2 to 320-5 are enabled or disabled by controlling the on/off states of the switches 310-2 to 310-5. In certain aspects, the ptune<0:3> code is a digital code (e.g., thermometer code) including multiple bits where the bit value of each bit controls the on/off state of a respective one of the switches 310-2 to 310-5. In this example, the ptune<0:3> code allows the delay control circuit 150 to adjust the current flowing through the first current terminal 356 by controlling which ones of the transistors 320-2 to 320-5 are enabled or disabled using the switches 310-2 to 310-5.

In some implementations, the switch 310-1 for the transistor 320-1 may be always on to maintain a minimum amount of current flow through the current terminal 356. However, it is to be appreciated that the first current circuit 315 is not limited to this example.

In the example shown in FIG. 3, the gates of the transistors 320-1 to 320-5 are biased by the bias voltage vbp. In this example, the gate bias voltage vbp controls the gate bias voltage of the transistors 320-1 to 320-5 which allows the delay control circuit 150 to make fine adjustments to the current flowing through the first current terminal 356 by adjusting the gate bias of the transistors 320-1 to 320-5. For the example where each of the transistors 320-1 to 320-5 is implemented with a respective PFET, increasing the gate bias voltage vbp decreases the current flow and decreasing the gate bias voltage vbp increases the current flow.

Thus, in this example, the delay control circuit 150 may adjust the current flowing through the first current terminal 356 (and hence the current drive strength of the delay device 350) using the switch control signal ptune<0:3>, the gate bias voltage vbp, or a combination of both.

The second current circuit 335 includes a second set of transistors 340-1 to 340-5 and a second set of switches 330-1 to 330-5 according to certain aspects. In this example, each of the transistors 340-1 to 340-5 is coupled in series with a respective one of the switches 330-1 to 330-5 between the second current terminal 358 of the delay device 350 and ground. In the example shown in FIG. 3, each of the switches 330-1 to 330-5 is implemented with a respective transistor 390-1 to 390-5 (e.g., respective NFET). The transistors 340-1 to 340-5 may be binary weighted in a similar manner as the transistors 320-2 to 320-5.

The switches 330-2 to 310-5 are used to select which ones of the transistors 340-2 to 340-5 are enabled or disabled based on the switch control signal ntune which includes an ntune <0:3> code in this example. More particularly, each of the transistors 340-2 to 340-5 is enabled when the respective one of the switches 330-2 to 330-5 is turned on (i.e., closed) and each of the transistors 340-2 to 340-5 is disabled when the respective one of the switches 330-2 to 330-5 is turn off (i.e., opened). In this example, the ntune<0:3> code controls which ones of the transistors 340-2 to 340-5 are enabled or disabled by controlling the on/off states of the switches 330-2 to 330-5. In certain aspects, the ntune<0:3> code is a digital code (e.g., thermometer code) including multiple bits where the bit value of each bit controls the on/off state of a respective one of the switches 330-2 to 330-5. Each bit of the ntune<0:3> code may be the complement of the corresponding bit in the ptune<0:3> code. In this example, the ntune<0:3> code allows the delay control circuit 150 to adjust the current flowing through the second current terminal 358 by controlling which ones of the transistors 340-2 to 340-5 are enabled or disabled using the switches 330-1 to 330-4.

In some implementations, the switch 330-1 of the transistor 340-1 may be always on to maintain a minimum amount of current flow through the current terminal 358. However, it is to be appreciated that the second current circuit 335 is not limited to this example.

In the example shown in FIG. 3, the gates of the transistors 340-1 to 340-5 are biased by the gate bias voltage vbn. In this example, the gate bias voltage vbn controls the gate bias voltage of the transistors 340-1 to 340-5 which allows the delay control circuit 150 to make fine adjustments to the current flowing through the second current terminal 358 by adjusting the gate bias of the transistors 340-1 to 340-5. For the example where each of the transistors 340-1 to 340-5 is implemented with a respective NFET, increasing the gate bias voltage vbn increases the current flow and decreasing the gate bias voltage vbn decreases the current flow.

Thus, in this example, the delay control circuit 150 may adjust the current flowing through the second current terminal 358 (and hence the current drive strength of the delay device 350) using the ntune<0:3> code, the gate bias voltage vbn, or a combination of both.

Referring back to FIG. 2, as discussed above, the delay control circuit 150 may tune the delay of the delay of the delay circuit 115 using the switch control signals ntune/ptune and/or the gate bias voltages vbn/vbp until the delay of the delay circuit 115 is approximately equal to one cycle (i.e., one period) of the clock signal clk_in. In this example, the delay control circuit 150 may use the switch control signals ntune/ptune to adjust the delay of the delay circuit 115 in coarse delay steps and use the gate bias voltages vbn/vbp to adjust the delay of the delay circuit 115 in fine delay steps.

For example, to lock the DLL 110, the delay control circuit 150 may first adjust the delay of the delay circuit 115 using the switch control signals ntune/ptune while observing the output 146 of the phase detector 140. In this example, the delay control circuit 150 may increase the delay of the delay circuit 115 using the switch control signals ntune/ptune until the output signal of the phase detector 140 toggles indicating that the delay of the delay circuit 115 has crossed one-cycle delay. The delay control circuit 150 may then decrease the switch control signals ntune/ptune by one coarse delay step. The delay control circuit 150 may then increase the delay of the delay circuit 115 in fine delay steps using the gate bias voltages vbp/vbn until the output signal of the phase detector 140 toggles again. At this point the DLL 205 may be locked.

Integrated transistors are subject to process variation which causes characteristics of the transistors to vary from chip to chip. The characteristics may include threshold voltages which result in variation in transistor speeds from chip to chip for given operating conditions (e.g., temperature and voltage). The extremes in the variation of the transistor speeds may be represented by process corners including a fast-fast (FF) corner and a slow-slow (SS) corner where the FF corner corresponds to fast PFETs and fast NFETs and the SS corner corresponds to slow PFETs and slow NFETs. It is desirable for a delay circuit design to meet certain performance requirements (e.g., bandwidth requirement) at the process corners to provide adequate design margins.

Figure 4:
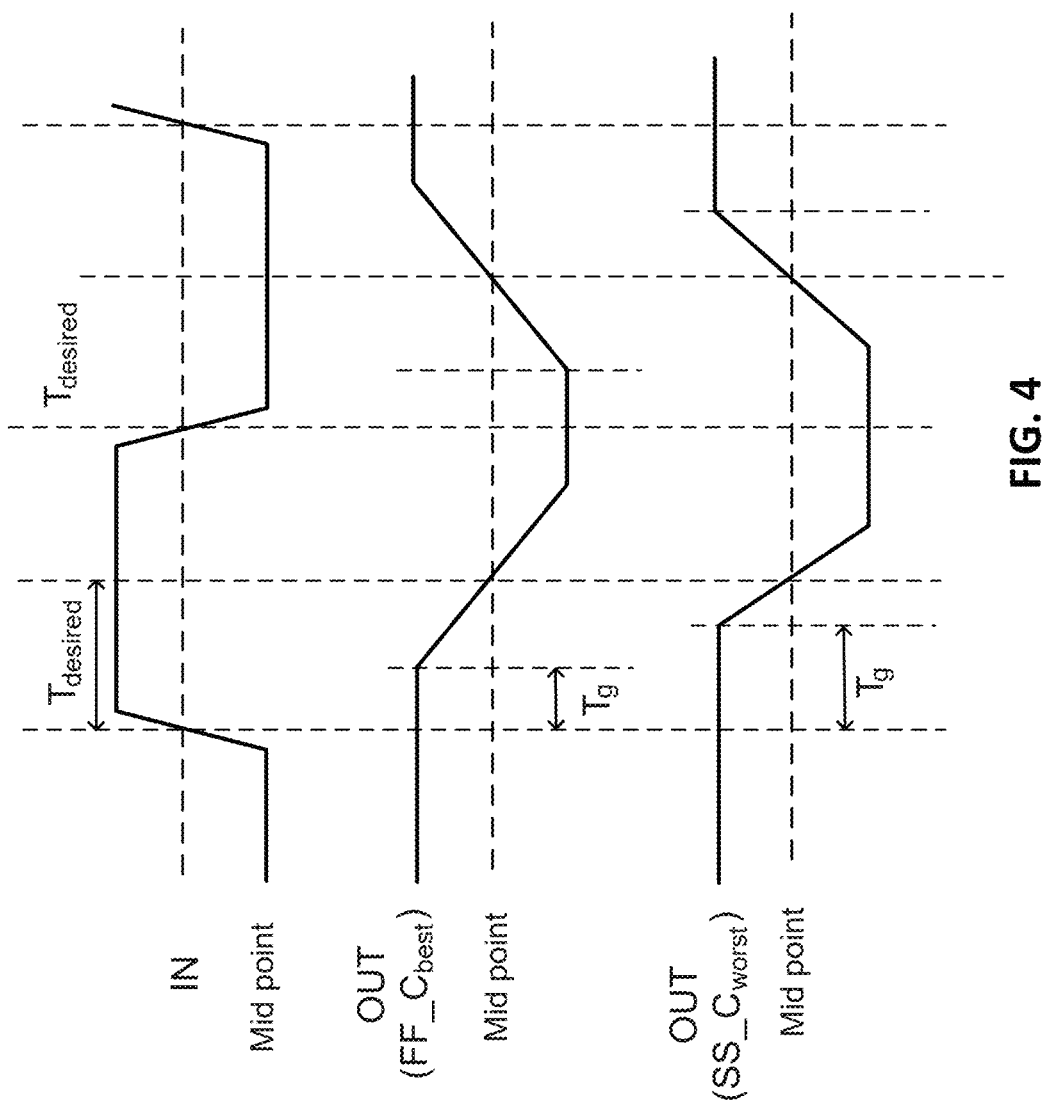
FIG. 4 is a timing diagram illustrating an example of the output signal of a delay buffer for different process corners according to certain aspects of the present disclosure.

An example of the effects of process variation on the bandwidth of a current starved delay buffer is illustrated in FIG. 4. In this example, the current starved delay buffer (e.g., current starved delay buffer 305) may be one of multiple cascaded delay buffers in a delay circuit (e.g., delay circuit 115) of a DLL (e.g., DLL 110).

FIG. 4 is a timing diagram illustrating an example of a signal (labeled "IN") that is input to the current starved delay buffer. The signal may be the clock signal clk_in or another signal. The timing diagram in FIG. 4 also illustrates an example of the output signal of the current starved delay buffer for an FF corner (labeled $FF\_C_{best}$) and an example of the output signal of the current starved delay buffer for an SS corner (labeled $SS\_C_{worst}$). Note that the current starved delay buffer is inverting in FIG. 4.

In the example shown in FIG. 4, the control circuit of the DLL (e.g., the delay control circuit 150) adjusts the delay control signals (e.g., control signals ntune/ptune and vbn/vbp) based on the output of the phase detector (e.g., phase detector 140) to achieve a desired delay $T_{desired}$ for each delay buffer in the delay circuit (e.g., delay circuit 115). In FIG. 4, when the DLL is locked, the output signal of the current starved delay buffer crosses the mid point at the desired delay $T_{desired}$ for both the FF corner and the SS corner.

As shown in FIG. 4, the FF corner has a smaller gate delay (labeled "$T_g$") compared with the SS corner. The smaller gate delay for the FF corner causes the rise/fall times of the output signal for the FF corner to be longer than the rise/fall times of the output signal for the SS corner. This is because the smaller gate delay for the FF corner requires that the DLL increase the rise time for the FF corner compared with the SS corner in order for the output signal to cross the midpoint at the desired delay $T_{desired}$. As a result, the DLL locks to a lower ntune/ptune code (and hence a lower current drive strength for the delay buffer) for the FF corner compared with the SS corner.

The longer rise/fall times for the FF corner reduces the bandwidth of the delay circuit (e.g., delay circuit 115) in the DLL. The longer rise/fall times for the FF corner also reduces the bandwidth of a slave delay circuit (e.g., delay circuit 170) controlled by the DLL. The lower bandwidth may lead to increased intersymbol interference (ISI) and attenuation of narrow pulses (which makes propagation of narrow pulses more challenging).

To address the above, aspects of the present disclosure add tunable capacitive loads to the outputs of the delay buffers (e.g., current starved inverters) in the DLL. In certain aspects, the DLL increases the capacitive loads for the FF corner compared with the SS corner. The higher capacitive loads for the FF corner causes the current drive strengths of the delay buffers to be higher in order to drive the higher capacitive loads. The higher current drive strengths reduce the rise/fall times of the delay buffers for the FF corner, which increase bandwidth. The above features and other features of the present disclosure are discussed further below.

Figure 5:
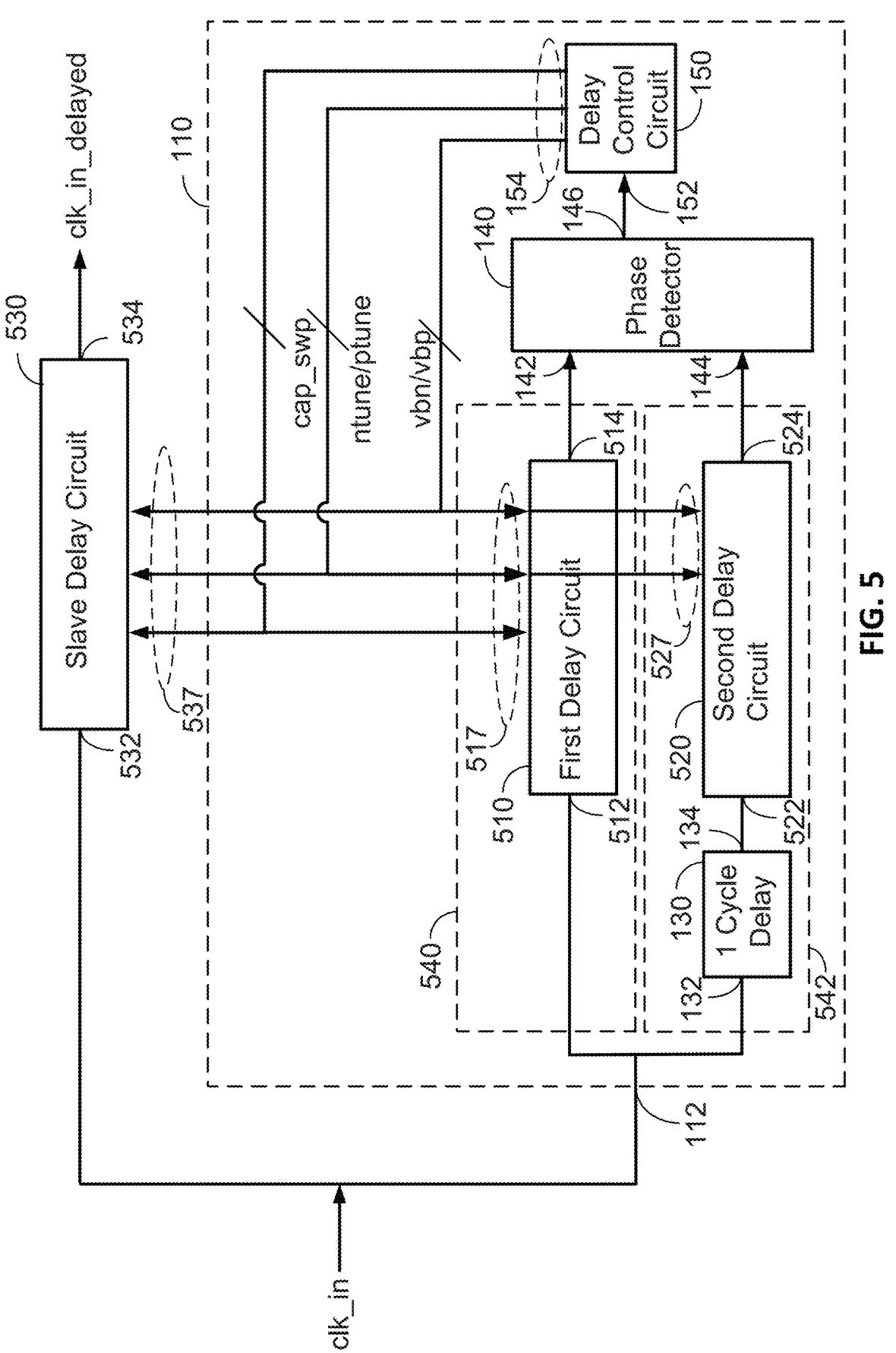
FIG. 5 shown an example of a DLL including a first delay circuit with tunable capacitive loads and a second delay circuit according to certain aspects of the present disclosure.
Figure 6:
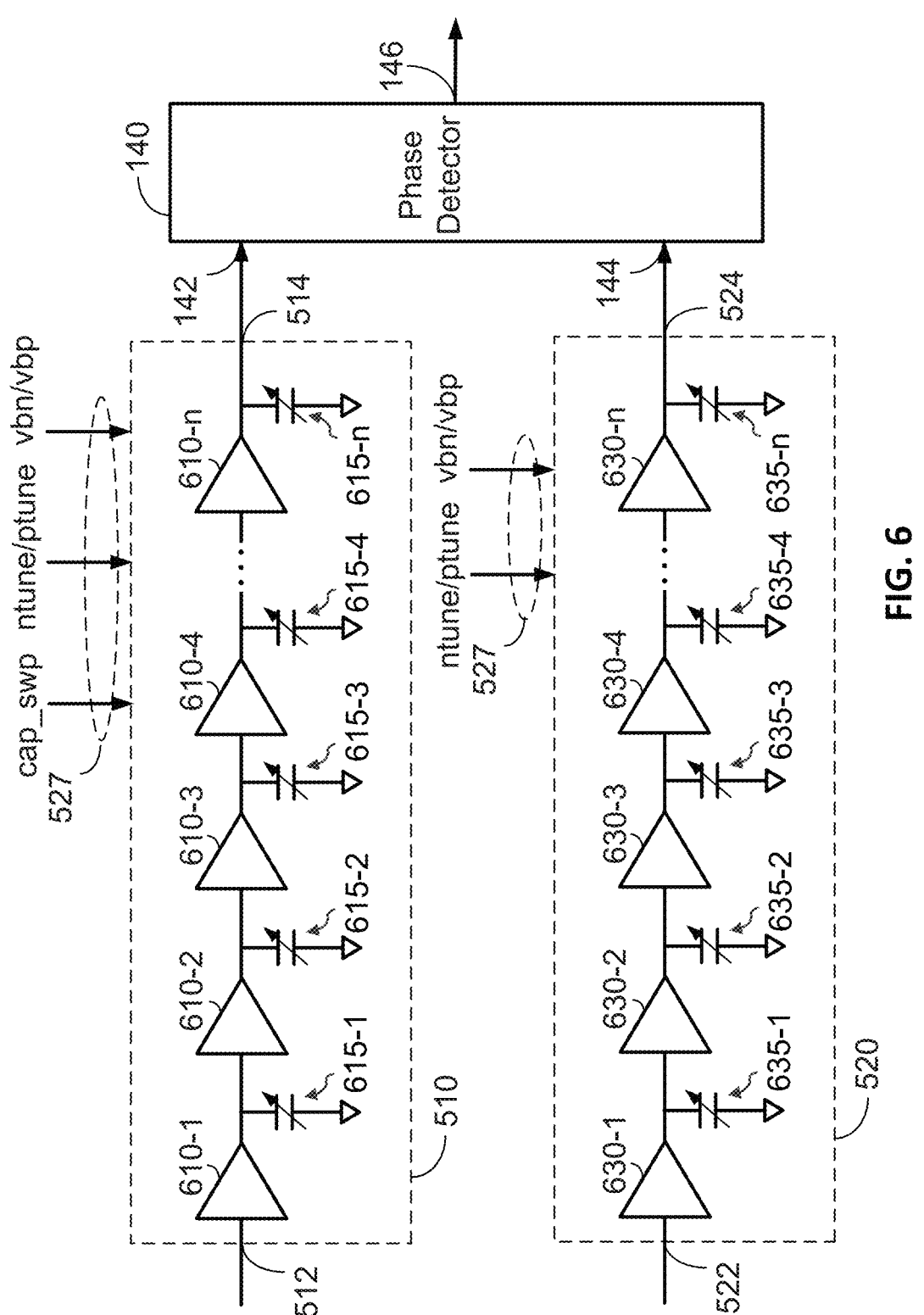
FIG. 6 shows an exemplary implementation of the first delay circuit and the second delay circuit according to certain aspects of the present disclosure.

FIG. 5 shows an example of the DLL 110 according to certain aspects. In this example, the DLL 110 includes the one-cycle delay circuit 130, the phase detector 140 (also referred to as a PFD), and the delay control circuit 150 discussed above. The DLL 110 also includes a first delay path 540 and a second delay path 542 (also referred to as a reference path). The first delay path 540 includes a first delay circuit 510 and the second delay path 542 includes the one-cycle delay circuit 130 and a second delay circuit 520 coupled in series. The first delay path 540 is coupled between the input 112 of the DLL 110 and the first input 142 of the phase detector 140. The second delay path 542 is coupled between the input 112 of the DLL 110 and the second input 144 of the phase detector 140. Exemplary implementations of the first delay circuit 510 and the second delay circuit 520 are shown in FIG. 6.

In this example, the first delay circuit 510 has an input 512, a control input 517, and an output 514. The input 512 is coupled to the input 112 of the DLL 110, the output 514 is coupled to the first input 142 of the phase detector 140, and the control input 517 is coupled to the output 154 of the delay control circuit 150. In the example shown in FIG. 5, the first delay circuit 510 is configured to receive the clock signal clk_in, delay the clock signal clk_in by a tunable first delay to obtain a first delayed clock signal, and output the first delayed clock signal to the first input 142 of the phase detector 140. In this example, the delay of the first delay path 540 is approximately equal to the first delay of the first delay circuit 510.

The second delay circuit 520 has an input 522, a control input 527, and an output 524. The input 132 of the one-cycle delay circuit 130 is coupled to the input 112 of the DLL 110 and the output 134 of the one-cycle delay circuit 130 is coupled to the input 522 of the second delay circuit 520. The control input 527 of the second delay circuit 520 is coupled to the output 154 of the delay control circuit 150 and the output 524 of the second delay circuit 520 is coupled to the second input 144 of the phase detector 140. In the example shown in FIG. 5, the one-cycle delay circuit 130 is configured to delay the clock signal clk_in by one clock cycle and output the one-cycle delayed clock signal to the input 522 of the second delay circuit 520. The second delay circuit 520 is configured to receive the one-cycle delayed clock signal, delay the one-cycle delayed clock signal by a tunable second delay to obtain a second delayed clock signal, and output the second delayed clock signal to the second input 144 of the phase detector 140. In this example, the delay of the second delay path 542 is approximately equal to the sum of one clock cycle and the second delay of the second delay circuit 520.

In the example shown in FIG. 5, the phase detector 140 is configured to compare the phases of the first delayed clock signal from the first delay path 540 with the second delayed clock signal from the second delay path 542, and output an output signal indicating the phase difference (i.e., phase error) between the first delayed clock signal and the second delayed clock signal. In one example, the phase detector 140 may be implemented with a bang-bang phase detector in which the output signal of the phase detector 140 indicates whether an edge of the first delayed clock signal is late or early with respect to an edge of the second delayed clock signal (i.e., indicates whether the delay of the first delay path 540 longer or shorter than the delay of the second delay path 542). It is to be appreciated that the phase detector 140 is not limited to this example.

Referring to FIG. 6, the first delay circuit 510 includes delay buffers 610-1 to 610-n coupled in series (i.e., cascaded delay buffers). In certain aspects, each of the delay buffers 610-1 to 610-n is implemented with a current starved delay buffer (e.g., current starved delay buffer 305) in which the current drive strength of the delay buffer is controlled by the ntune/ptune codes and/or the bias voltages vbn/vbp.

The first delay circuit 510 also includes tunable load capacitors 615-1 to 615-n in which each of the load capacitors 615-1 to 615-n is coupled to the output of a respective one of the delay buffers 610-1 to 610-n. In this example, the delay control circuit 150 outputs a capacitive load control signal cap_swp to control the capacitive loads of the load capacitors 615-1 to 615-n, as discussed further below.

Figure 7:
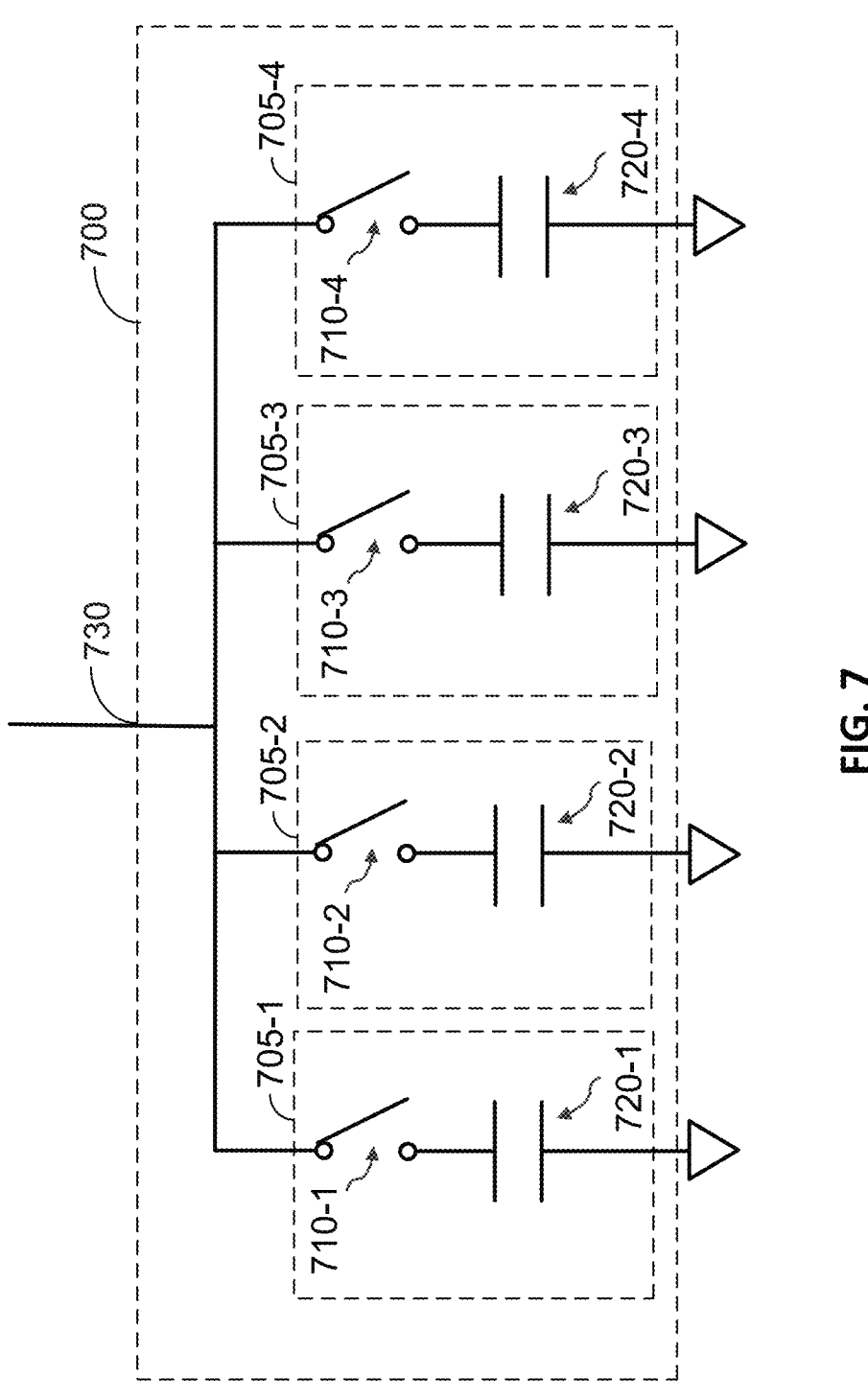
FIG. 7 shows an exemplary implementation of a load capacitor including switchable capacitors according to certain aspects of the present disclosure.

In certain aspects, each of the tunable load capacitors 615-1 to 615-n is implemented with a switch-capacitor network. In this regard, FIG. 7 shows an example of a switch-capacitor network 700 according to certain aspects. Each of the load capacitors 615-1 to 615-n may be implemented with a respective instance of the switch-capacitor network 700. In this example, the switch-capacitor network 700 includes switchable capacitors 705-1 to 705-4 coupled in parallel between a node 730 and ground (or some reference voltage). The node 730 may be coupled to the output of a delay buffer (e.g., respective one of the delay buffers 610-1 to 610-n) to provide a tunable capacitive load at the output of the delay buffer.

In this example, each of the switchable capacitors 705-1 to 705-4 includes a respective switch 710-1 to 710-4 and a respective capacitor 720-1 to 720-4 coupled in series. In this example, the capacitance of the switch-capacitor network 700 is tuned by controlling which ones of the switchable capacitors 705-1 to 705-4 are turned on. As used herein, a switchable capacitor includes a switch and a capacitor coupled in series in which the switchable capacitor is turned off by turning off the switch and turned on by turning on the switch. In this example, the capacitance of the switch-capacitor network 700 is approximately equal to the sum of the capacitances of the switchable capacitors 705-1 to 705-4 that are turned on. The highest capacitance setting occurs when all of the switchable capacitors 705-1 to 705-n are turned on (i.e., all of the respective switches 710-1 to 710-4 are turned on). In this case, the capacitance at the node 730 is approximately equal to the sum of all of the capacitances of the capacitors 720-1 to 720-4. In this example, the capacitance of the switch-capacitor network 700 may be controlled by multiple bits where each of the bits controls the on/off state of a respective one of the switches 710-1 to 710-4.

Returning to FIG. 6, the capacitive load control signal cap_swp from the delay control circuit 150 may include a digital code (e.g., a thermometer code) including multiple bits where each of the bits controls an on/off state of a respective one of the switchable capacitors in a respective one of the load capacitors 615-1 to 615-$n$. In this example, the capacitive load control signal cap_swp may also be referred to as the cap_swp code or capacitive load control code. In one example, there may be 24 load capacitors 615-1 to 615-$n$ where each of the load capacitors 615-1 to 615-$n$ includes four switchable capacitors (e.g., respective instance of switchable capacitors 705-1 to 705-4) for a total of 96 switchable capacitors (i.e., four times 24). In this example, the cap_swp code may include 96 bits (i.e., one for each switchable capacitor) with 96 capacitive load settings (i.e., values) in which the minimum capacitive load setting (i.e., minimum value) corresponds to all of the switchable capacitors being turned off and the maximum capacitive load setting (i.e., maximum value) corresponds to all of the switchable capacitors being turned on. In this example, the delay control circuit 150 uses the cap_swp code to tune the capacitive loads of the first delay circuit 510, as discussed further below. It is to be appreciated that the present disclosure is not limited to the exemplary number of delay buffers and switchable capacitors given above.

In the example shown in FIG. 6, the second delay circuit 520 may be a replica of the first delay circuit 510. The second delay circuit 520 includes delay buffers 630-1 to 630-$n$ coupled in series (i.e., cascaded delay buffers) where the delay buffers 630-1 to 630-$n$ may be replicas of the delay buffers 610-1 to 610-$n$ in the first delay circuit 510. In certain aspects, the current drive strength of each of the delay buffers 630-1 to 630-$n$ is controlled by the ntune/ptune codes and/or the bias voltages vbn/vbp from the delay control circuit 150.

The second delay circuit 520 also includes load capacitors 635-1 to 635-$n$ which may be replicas of the load capacitors 615-1 to 615-$n$. Each of the load capacitors 635-1 to 635-$n$ is coupled to the output of a respective one of the delay buffers 630-1 to 630-$n$. In certain aspect, all of the switchable capacitors in the load capacitors 635-1 635-$n$ are turned off. For example, all of the switchable capacitors may be wired to always be turned off. In this example, the delay of the second delay circuit 520 approximately matches the delay of the first delay circuit 510 when the cap_swp code is at the minimum capacitive load setting discussed above. Thus, in this example, the difference between the first delay of the first delay circuit 510 and the second delay of the second delay circuit 520 is approximately equal to the delay in the first delay circuit 510 due to the capacitive loads of the switching capacitors that are turned on in the first delay circuit 510. The delay difference between the first delay circuit 510 and the second delay circuit 520 may be increased by increasing the cap_swp code (i.e., increasing the number of switchable capacitors that are turned on in the first delay circuit 510), as discussed further below.

Figure 8:
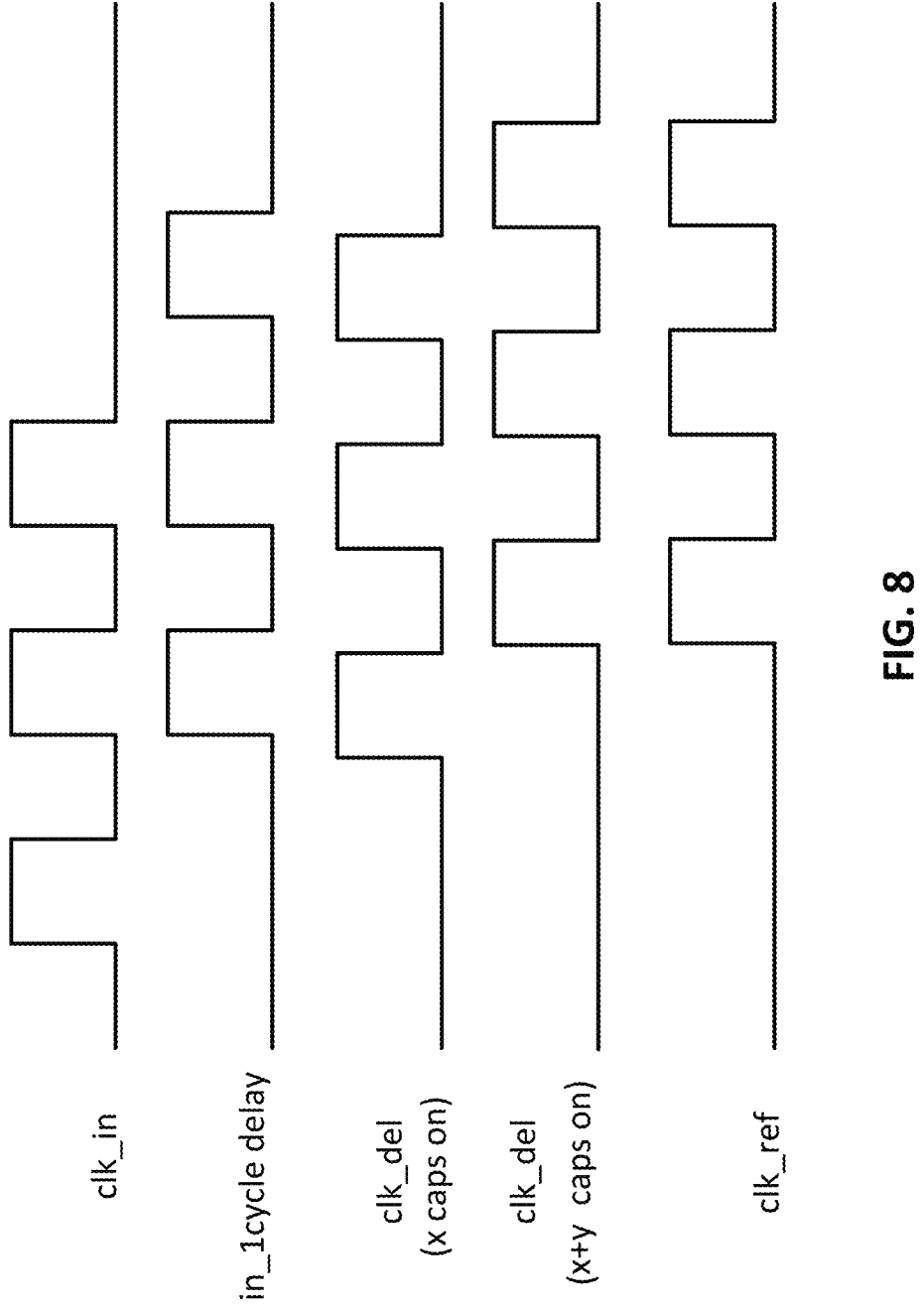
FIG. 8 is a timing diagram showing an example of signals in a first delay path and a second delay path of a DLL according to certain aspects of the present disclosure.

A method for calibrating the first delay of the first delay circuit 510 using the DLL 110 will now be discussed with reference to FIG. 8 according to certain aspects. FIG. 8 is a timing diagram illustrating an example of the clock signal clk_in input to the DLL 110, an example of the one-cycle delayed clock signal (labeled "in_1cycle delay), and an example of the second delayed clock signal (labeled "clk_ref") input to the second input 144 of the phase detector 140 from the second delay path 542 (also referred to as the reference path). In this example, the delay of the second delay path 542 is approximately equal to the sum of one clock cycle delay and the second delay of the second delay circuit 520. As discussed above, the second delay of the second delay circuit 520 approximately matches the first delay of the first delay circuit 510 when the cap_swp code is set to the minimum code.

In this example, the delay control circuit 150 may set the current drive strengths of the delay buffers 610-1 to 610-$n$ in the first delay circuit 510 and the delay buffers 630-1 to 630-$n$ in the second delay circuit 520 to a high current drive strength setting (e.g., close to or at a maximum current drive strength setting) using ntune/ptune codes and/or the bias voltages vbn/vbp. The high current drive strength setting may correspond to a setting at which most or all of the switches in the delay buffers 610-1 to 610-$n$ and the delay buffers 630-1 to 630-$n$ are turned on, the bias voltage vbn is at or close to a maximum voltage level, and the bias voltage vbp is at or close to a minimum voltage level.

In this example, the delay control circuit 150 may initially set the cap_swp code to a code at which x number of the switchable capacitors in the load capacitors 615-1 to 615-$n$ are turned on where x is between zero and the total number of switchable capacitors. For example, in the example where the totable number of switchable capacitors is 96, x may be equal to 64. Thus, in this example, 64 of the switchable capacitors are initially turned on. However, it is to be appreciated that the present disclosure is not limited to this example. In general, the initial number of switchable capacitors that are turned on (i.e., x) may be set to a number greater than zero to speed up the calibration time.

FIG. 8 shows an example of the first delayed signal (labeled "clk_del (x caps on)") for the initial cap_swp code in which x (i.e., 64) of the switchable capacitors are turned on. In the example shown in FIG. 8, the delay of the first delay path 540 is less than the delay of one clock cycle. However, it is to be appreciated that the present disclosure is not limited to this example.

As shown in FIG. 8, initially the first delayed signal (labeled "clk_del (x caps on)") input to the first input 142 of the phase detector 140 is early with respect to the second delayed signal (labeled "clk_ref") input to the second input 144 of the phase detector 140. In other words, the delay of the first delay path 540 is less than the delay of the second delay path 542 (i.e., the sum of one clock cycle and the second delay of the second delay circuit 520).

After the initial settings, the delay control circuit 150 may sweep the cap_swp code by increasing the cap_swp code from the initial code (i.e., x) to the maximum code (e.g., 96). This causes the number of switchable capacitors in the load capacitors 615-1 to 615-$n$ that are turned on to increase, and hence the capacitive loads in the first delay circuit 510 to increase. For example, the delay control circuit 150 may increase the number of switchable capacitors that are turned on by incrementing the cap_swp code.

While sweeping the cap_swp code, the delay control circuit 150 observes the output 146 of the phase detector 140. As the cap_swp code increases, the capacitive loads in the first delay circuit 510 increase, which increases the delay of the first delay path 540 relative to the second delay path 542. The delay control circuit 150 may record the cap_swp code at which the output signal of the phase detector 140 indicates that the phase (e.g., edge) of first delayed signal at the first input 142 is approximately aligned with the phase of the second delayed signal at the second input 144 (i.e., the delay of the first delay path 540 approximately equals the delay of the second delay path 542). For example, the output signal of the phase detector 140 may toggle (e.g., toggle between output logic states) when the phase (e.g., edge) of first delayed signal at the first input 142 is approximately aligned with the phase of the second delayed signal at the second input 144. In this example, the delay control circuit 150 may record the cap_swp code at the output signal of the phase detector 140 toggles or the cap_swp code immediately before the output signal of the phase detector 140 toggles.

FIG. 8 shows an example in which the phase (e.g., edge) of the first delayed signal (labeled "clk_del (x+y caps on)") is approximately aligned with the phase (e.g., edge) the second delayed signal (labeled "clk_ref"). In this example, the cap_swp code turns on x+y switchable capacitors where y is the additional number of switchable capacitors that are turned from the initial number of x.

The delay control circuit 150 may set the cap_swp code at the recorded code, which may be stored in a register. This causes the phase (e.g., edge) of the first delayed signal at the first input 142 to be approximately aligned with the phase of the second delayed signal at the second input 144 (i.e., the delay of the first delay path 540 approximately equals the delay of the second delay path 542). When this occurs, the difference between the first delay of the first delay circuit 510 and the second delay of the second delay circuit 520 is approximately equal to one clock cycle. As discussed above, the delay difference between the first delay circuit 510 and the second delay circuit 520 is due to the capacitive loads of the switching capacitors that are turned on in the first delay circuit 510. Thus, in this example, the cap_swp code is locked when the delay difference is approximately equal to one clock cycle. In other words, the delay difference between the first delay circuit 510 and the second delay circuit 520 is calibrated to be approximately equal to one clock cycle.

After calibration of the cap_swp code, the delay control circuit 150 may further tune the ntune/ptune codes and/or the bias voltages vbn/vbp to make the delay difference between the first delay circuit 510 and the second delay circuit 520 even closer to one clock cycle. In some cases, the cap-swp code may reach the maximum code (e.g., 96) before the delay of the first delay path 540 reaches the delay of the second delay path 542. In these cases, the delay control circuit 150 may set (i.e., lock) the cap-swp code to the maximum code and then tune the ntune/ptune codes and/or the bias voltages vbn/vbp until the delay of the first delay path 540 is approximately equal to the delay of the second delay path 542 (i.e., the delay difference between the first delay circuit 510 and the second delay circuit 520 is approximately to one clock cycle). In this example, decreasing the current drive strengths of the delay buffers 610-1 to 610-*n* and the delay buffers 630-1 to 630-*n* increases the delay difference between the first delay circuit 510 and the second delay circuit 520 due to the capacitive loads in the first delay circuit 510. Thus, in this example, after the cap_swp code is set to the maximum code, the delay control circuit 150 may decrease the current drive strengths of the delay buffers 610-1 to 610-*n* and the delay buffers 630-1 to 630 using the ntune/ptune codes and/or the bias voltages vbn/vbp until the delay of the first delay path 540 is approximately equal to the delay of the second delay path 542 (i.e., the delay difference between the first delay circuit 510 and the second delay circuit 520 is approximately to one clock cycle).

In this example, the additional delay from the capacitive loads of the load capacitors 615-1 to 615-*n* causes the DLL 110 to set the current drive strengths of the delay buffers 610-1 to 610-*n* to a higher setting for the FF corner compared with the case in FIG. 1 with no load capacitors. The higher current drive strengths of the delay buffers 610-1 to

610-*n* reduce the rise/fall times of the delay buffers for the FF corner, which increase bandwidth.

Figure 9:
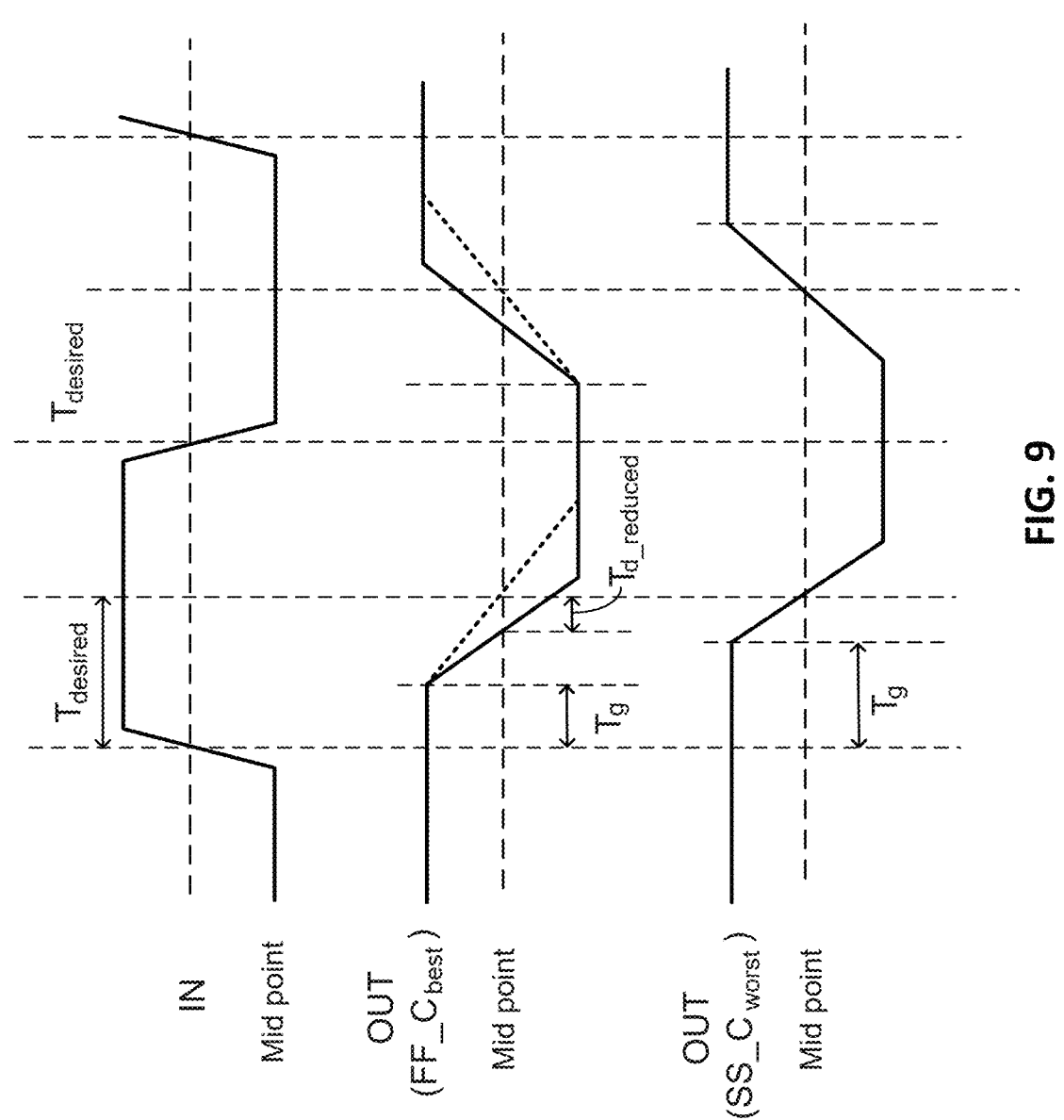
FIG. 9 is a timing diagram illustrating an example of the output signal of a delay buffer for different process corners in which a capacitive load is coupled to the output of the delay buffer according to certain aspects of the present disclosure.

An example of this is illustrated in FIG. 9, which is a timing diagram illustrating the effect of a capacitive load (e.g., one of the load capacitors 615-1 to 615-*n*) on the rise/fall times of the current starved delay buffer in FIG. 4 for the FF corner and the SS corner. Note that the delay buffer is inverting in FIG. 9.

In the example shown in FIG. 9, the control circuit of the DLL (e.g., the delay control circuit 150) calibrates the capacitive load at the output of the delay buffer (e.g., based on the calibration method discussed above in which the current drive strength is initially set high). As shown in FIG. 9, the capacitive load causes the rise/fall times of the output signal of the delay buffer for the FF corner to decrease, which results in the output signal crossing the mid point earlier compared with the case of no capacitive load shown in FIG. 4. For comparison, the output signal for the case of no capacitive load is shown in dotted line in FIG. 9. In the example shown in FIG. 9, the delay for the mid point crossing is reduced by Ta. The reduced rise/fall times of the FF corner translates into increased bandwidth.

For the case of the SS corner, the capacitive load is set lower compared with the FF corner (e.g., cap_swp is lower). This is because the transistors in the delay buffer are slower for the SS corner. As a result, less capacitive load is needed to make the delay of the first delay path 540 approximately equal to the delay of the second delay path 542 during calibration of the cap_swp code. In the example shown in FIG. 9, the lower capacitive load setting for the SS corner causes the mid point crossing for the output signal to be approximately unchanged for the SS corner compared with FIG. 4. In this example, the rise/fall times of the delay buffer for the SS corner may not need to be decreased further to provide sufficient bandwidth as opposed to the FF corner. Also, reducing the rise/fall times of the delay buffer further for the SS corner may not be viable due to speed limitations of the SS corner.

Referring back to FIG. 5, the calibrated delay control signals cap_swp code, ntune/ptune codes, and/or the bias voltages vbn/vbp from the delay control circuit 150 may be sent to a slave delay circuit 530 to control the delay of the slave delay circuit 530. In this example, the delay circuit 530 has an input 532, an output 534, and a control input 535 coupled to the output 154 of the delay control circuit 150. The input 532 of the delay circuit 530 is configured to receive a signal (e.g., the clock signal clk_in or another signal), delay the signal by the tunable delay of the delay circuit 530 to adjust the timing of the signal, and output the delayed signal at the output 534. In this example, the delay circuit 530 is configured to receive the delay control signals cap_swp code, ntune/ptune codes, and/or the bias voltages vbn/vbp from the delay control circuit 150, and set the delay of the delay circuit 530 based on the received delay control signals. The delay circuit 530 may include delay buffers similar to the delay buffers 610-1 to 610-*n* and load capacitors similar to the load capacitors 615-1 to 615-*n*.

Figure 10:
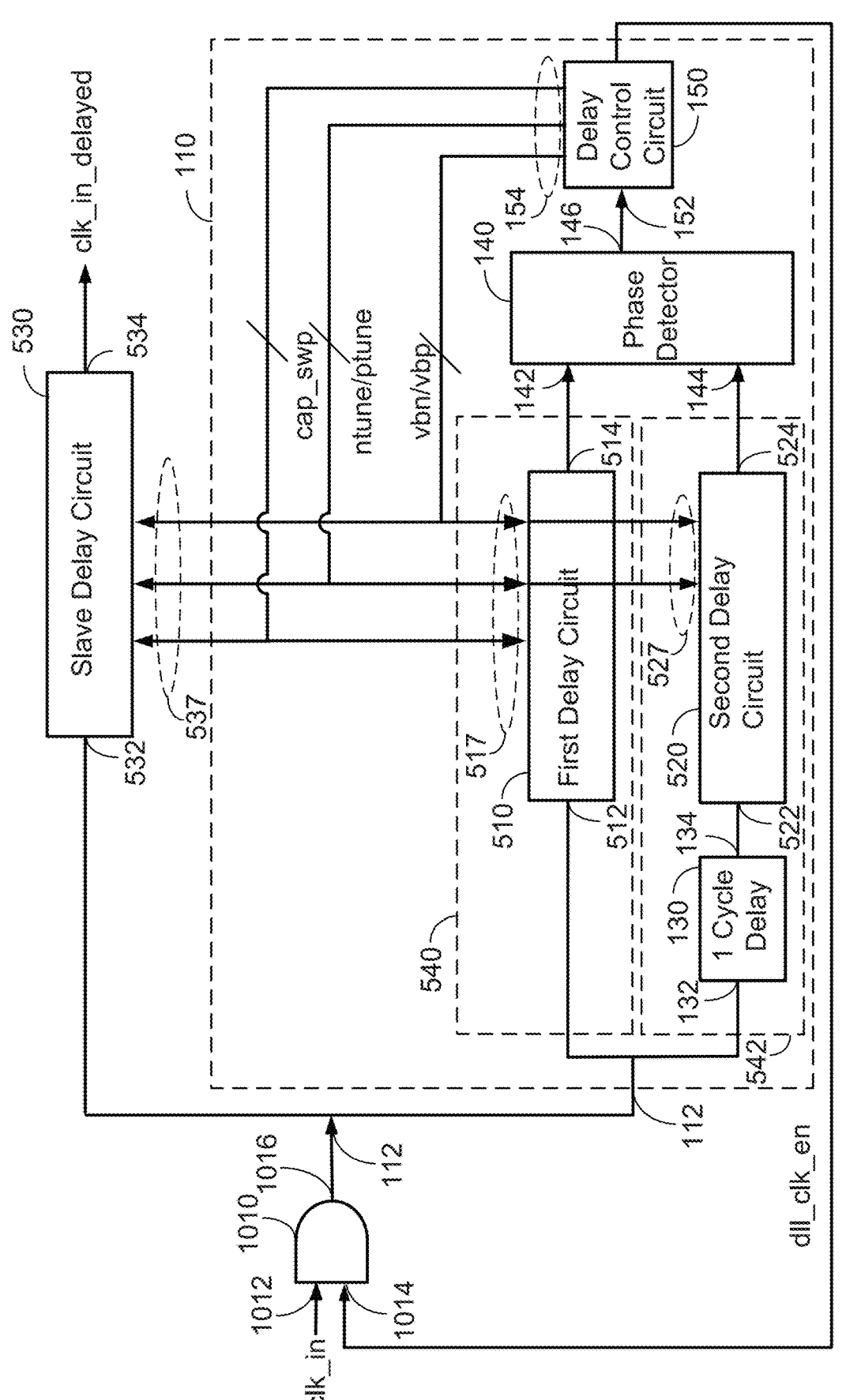
FIG. 10 shows an example of a gating circuit coupled to an input of a DLL according to certain aspects of the present disclosure.

FIG. 10 shows an example in which a gating circuit 1010 is coupled to the input 112 of the DLL 110 for selectively gating the clock signal clk_in. In this example, the gating circuit 1010 has a first input 1012, a second input 1014, and an output 1016 coupled to the input 112 of the DLL 110. The first input 1012 is configured to receive the clock signal clk_in and the second input 1014 is coupled to the delay control circuit 150.

The delay control circuit 150 controls the gating circuit 1010 using an enable signal (labeled "dll_clk_en"). In the example shown in FIG. 10, the gating circuit 1010 is implemented with an AND gate. In this example, the delay control circuit 150 causes the gating circuit 1010 to pass the clock signal clk_in to the DLL 110 by setting the enable signal high. The delay control circuit 150 causes the gating circuit 1010 to gate (i.e., block) the clock signal clk_in by setting the enable signal low. For example, the delay control circuit 150 may cause the gating circuit 1010 to gate the clock signal clk_in when calibration is completed to conserve power in the DLL 110. It is to be appreciated that the gating circuit 1010 is not limited to an AND gate and that the gating circuit 1010 may be implemented with other types of logic gates in other implementations.

Figure 11:
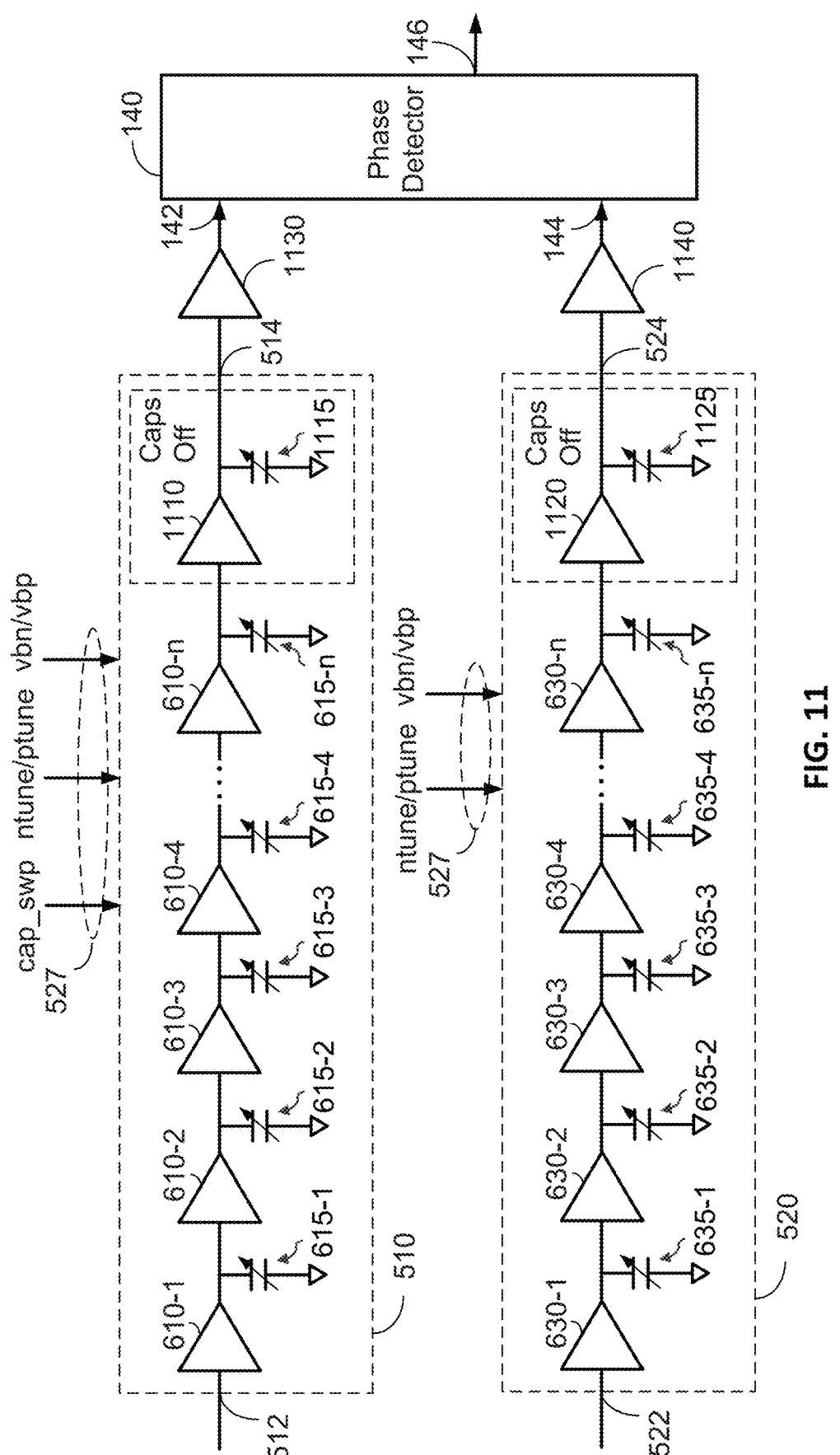
FIG. 11 shows an example in which the first delay path and the second delay path include drivers for driving inputs of a phase detector according to certain aspects of the present disclosure.

FIG. 11 shows an example in which the first delay path 540 includes a first driver 1130 between the first delay circuit 510 and the first input 142 of the phase detector 140, and the second delay path 542 includes a second driver 1140 between the second delay circuit 520 and the second input 144 of the phase detector 140. In this example, the first driver 1130 drives the first input 142 with the first delayed signal from the first delay circuit 510, and the second driver 1140 drives the second input 144 with the second delay signal from the second delay circuit 520.

In the example shown in FIG. 11, the first delay circuit 510 includes an additional delay buffer 1110 and load capacitor 1115 in which the output of the delay buffer 1110 is coupled to the input of the first driver 1130. Also, in this example, the second delay circuit 520 includes an additional delay buffer 1120 and load capacitor 1125 in which the output of the delay buffer 1120 is coupled to the input of the second driver 1140. In this example, both of the load capacitors 1115 and 1125 are turned off (e.g., all of the switchable capacitors in the load capacitors 1115 and 1125 are turned off). This helps ensure that the capacitances driven by the outputs of the delay buffers 1110 and 1120 approximately match (assuming the input capacitances of the drivers 1130 and 1140 are approximately equal).

FIG. 12 illustrates a method 1200 of calibration in a delay locked loop (DLL) according to certain aspects. The DLL (e.g., DLL 110) includes a phase detector (e.g., phase detector 140), a first delay path (e.g., the first delay path 540) coupled between an input (e.g., the input 112) of the DLL and a first input (e.g., first input 142) of the phase detector, and a second delay path (e.g., second delay path 542) coupled between the input of the DLL and a second input (e.g., second input 144) of the phase detector. The first delay path includes a first delay circuit (e.g., first delay circuit 510), and the second delay path includes a one-cycle delay circuit (e.g., one-cycle delay circuit 130) and a second delay circuit (e.g., second delay circuit 520) coupled in series.

At block 1210, a capacitive load control code is output to the first delay circuit, wherein the capacitive load control code controls capacitive loads of load capacitors in the first delay circuit. For example, the capacitive load control code may be output by the delay control circuit 150. The capacitive load control code may correspond to the cap_swp code.

At block 1220, the capacitive load control code is swept from a first value to a second value. For example, the capacitive load control code may be swept by the delay control circuit 150. The first value may correspond to a first code (e.g., 64) greater than the minimum code (e.g., 0) to speed up the calibration time. The second value may correspond to the maximum code (e.g., 96) or another code greater than the first code.

At block 1230, a third value of the capacitive load control code at which an output of the phase detector indicates that a delay of the first delay path is approximately equal to a delay of the second delay path is recorded. For example, the third value may be recorded by the delay control circuit 150 which may store the third value in a register. The third value may be a code at which the output of the phase detector 140 toggles (e.g., toggles between output logic states) or a code just before the code at which the output of the phase detector toggles.

At block 1240, the capacitive load control code is set at the third value. For example, the delay control circuit 150 may set (i.e., lock) the capacitive load control code at the third value.

In certain aspects, the third value is between the first value and the second value.

In certain aspects, the second value is a maximum value (e.g., 96) of the capacitive load control signal.

In certain aspects, the third value and the second value are the same.

In certain aspects, the load capacitors include switchable capacitors, and the capacitive load control code controls a number of the switchable capacitors that are turned on.

In certain aspects, the method 1200 may also include outputting a current control signal (e.g., ntune/ptune and/or vbn/vbp) to the first delay circuit and the second delay circuit, wherein the current control signal controls current drive strengths of first delay buffers (e.g., delay buffers 610-1 to 610-$n$) in the first delay circuit and current drive strengths of second delay buffers (e.g., delay buffers 630-1 to 630-$n$) in the second delay circuit, and holding the current control signal constant during the sweeping of the capacitive load control code. For example, during the sweep, the current control signal may be set to a high current drive setting close to or at a maximum current drive setting.

In certain aspects, the first delay buffers include first current starved inverters and the second delay buffers include second current starved inverters.

The delay control circuit 150 may be implemented with a general-purpose processor, a digital signal processor (DSP), an application specific integrated circuit (ASIC), a field programmable gate array (FPGA) or other programmable logic device, a digital finite state machine (FSM), discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk. The delay control circuit 150 may also include one or more DACs for generating the bias voltages vbn/vbp.

Implementation examples are described in the following numbered clauses:

1. A delay locked loop (DLL), comprising:
a phase detector having a first input, a second input, and an output;
a first delay path coupled between an input of the DLL and the first input of the phase detector, wherein the first delay path includes a first delay circuit, and the first delay circuit comprises:
first delay buffers coupled in series; and
load capacitors, wherein each of the load capacitors is coupled to an output of a respective one of the first delay buffers;
a second delay path coupled between the input of the DLL and the second input of the phase detector, wherein the second delay path includes a one-cycle delay circuit and a second delay circuit coupled in series; and a control circuit coupled to the output of the phase detector, the first delay circuit, and the second delay circuit.

2. The DLL of clause 1, wherein the control circuit is configured to:

output a capacitive load control code to the first delay circuit, wherein the capacitive load control code controls capacitive loads of the load capacitors; and sweep the capacitive load control code from a first value to a second value.

3. The DLL of clause 2, wherein the control circuit is configured to:

record a third value of the capacitive load control code at which the output of the phase detector indicates that a delay of the first delay path is approximately equal to a delay of the second delay path; and set the capacitive load control code at the third value.

4. The DLL of clause 3, wherein the third value is between the first value and the second value.

5. The DLL of clause 4, wherein the second value is a maximum value of the capacitive load control code.

6. The DLL of clause 4 or 5, wherein the first value is greater than a minimum value of the capacitor load control code.

7. The DLL of any one of clauses 3 to 6, wherein the third value and the second value are the same.

8. The DLL of any one of clauses 2 to 7, wherein the load capacitors comprise switchable capacitors, and the capacitive load control code controls a number of the switchable capacitors that are turned on.

9. The DLL of any one of clauses 2 to 8, wherein the second delay circuit comprises second delay buffers coupled in series.

10. The DLL of clause 9, wherein the control circuit is configured to output a current control signal to the first delay circuit and the second delay circuit, and the current control signal controls current drive strengths of the first delay buffers and current drive strengths of the second delay buffers.

11. The DLL of clause 10, wherein the first delay buffers comprise first current starved inverters and the second delay buffers comprise second current starved inverters.

12. The DLL of clause 10 or 11, wherein the control circuit is configured to hold the current control signal constant during the sweep of the capacitive load control code.

13. A method of calibration in a delay locked loop (DLL), wherein the DLL includes a phase detector, a first delay path coupled between an input of the DLL and a first input of the phase detector, and a second delay path coupled between the input of the DLL and a second input of the phase detector, and wherein the first delay path includes a first delay circuit, and the second delay path includes a one-cycle delay circuit and a second delay circuit coupled in series, the method comprising:

outputting a capacitive load control code to the first delay circuit, wherein the capacitive load control code controls capacitive loads of load capacitors in the first delay circuit;

sweeping the capacitive load control code from a first value to a second value;

recording a third value of the capacitive load control code at which an output of the phase detector indicates that a delay of the first delay path is approximately equal to a delay of the second delay path; and setting the capacitive load control code at the third value.

14. The method of clause 13, wherein the third value is between the first value and the second value.

15. The method of clause 14, wherein the second value is a maximum value of the capacitive load control code.

16. The method of clause 14 or 15, wherein the first value is greater than a minimum value of the capacitor load control code.

17. The method of any one of clauses 13 to 16, wherein the third value is between the first value and the second value.

18. The method of any one of clauses 13 to 17, wherein the load capacitors comprise switchable capacitors, and the capacitive load control code controls a number of the switchable capacitors that are turned on.

19. The method of any one of clauses 13 to 18, further comprising:

outputting a current control signal to the first delay circuit and the second delay circuit, wherein the current control signal controls current drive strengths of first delay buffers in the first delay circuit and current drive strengths of second delay buffers in the second delay circuit; and holding the current control signal constant during the sweeping of the capacitive load control code.

20. The method of clause 19, wherein the first delay buffers comprise first current starved inverters and the second delay buffers comprise second current starved inverters.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities. As used herein, A (e.g., a delay of a first delay path) and B (e.g., a delay of a second delay path) are approximately equal when A is within a range of 90 to 110 percent of B.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A delay locked loop (DLL), comprising:

a phase detector having a first input, a second input, and an output;

a first delay path coupled between an input of the DLL and the first input of the phase detector, wherein the first delay path includes a first delay circuit, and the first delay circuit comprises:

first delay buffers coupled in series; and load capacitors, wherein each of the load capacitors is coupled to an output of a respective one of the first delay buffers;

a second delay path coupled between the input of the DLL and the second input of the phase detector, wherein the second delay path includes a one-cycle delay circuit and a second delay circuit coupled in series; and a control circuit coupled to the output of the phase detector, the first delay circuit, and the second delay circuit.

2. The DLL of claim 1, wherein the control circuit is configured to:

output a capacitive load control code to the first delay circuit, wherein the capacitive load control code controls capacitive loads of the load capacitors; and sweep the capacitive load control code from a first value to a second value.

3. The DLL of claim 2, wherein the control circuit is configured to:

record a third value of the capacitive load control code at which the output of the phase detector indicates that a delay of the first delay path is approximately equal to a delay of the second delay path; and set the capacitive load control code at the third value.

4. The DLL of claim 3, wherein the third value is between the first value and the second value.

5. The DLL of claim 4, wherein the second value is a maximum value of the capacitive load control code.

6. The DLL of claim 4, wherein the first value is greater than a minimum value of the capacitor load control code.

7. The DLL of claim 3, wherein the third value and the second value are the same.

8. The DLL of claim 2, wherein the load capacitors comprise switchable capacitors, and the capacitive load control code controls a number of the switchable capacitors that are turned on.

9. The DLL of claim 2, wherein the second delay circuit comprises second delay buffers coupled in series.

10. The DLL of claim 9, wherein the control circuit is configured to output a current control signal to the first delay circuit and the second delay circuit, and the current control signal controls current drive strengths of the first delay buffers and current drive strengths of the second delay buffers.

11. The DLL of claim 10, wherein the first delay buffers comprise first current starved inverters and the second delay buffers comprise second current starved inverters.

12. The DLL of claim 10, wherein the control circuit is configured to hold the current control signal constant during the sweep of the capacitive load control code.

13. A method of calibration in a delay locked loop (DLL), wherein the DLL includes a phase detector, a first delay path coupled between an input of the DLL and a first input of the phase detector, and a second delay path coupled between the input of the DLL and a second input of the phase detector, and wherein the first delay path includes a first delay circuit, and the second delay path includes a one-cycle delay circuit and a second delay circuit coupled in series, the method comprising:

outputting a capacitive load control code to the first delay circuit, wherein the capacitive load control code controls capacitive loads of load capacitors in the first delay circuit;

sweeping the capacitive load control code from a first value to a second value;

recording a third value of the capacitive load control code at which an output of the phase detector indicates that a delay of the first delay path is approximately equal to a delay of the second delay path; and setting the capacitive load control code at the third value.

14. The method of claim 13, wherein the third value is between the first value and the second value.

15. The method of claim 14, wherein the second value is a maximum value of the capacitive load control code.

16. The method of claim 14, wherein the first value is greater than a minimum value of the capacitor load control code.

17. The method of claim 13, wherein the third value is between the first value and the second value.

18. The method of claim 13, wherein the load capacitors comprise switchable capacitors, and the capacitive load control code controls a number of the switchable capacitors that are turned on.

19. The method of claim 13, further comprising:

outputting a current control signal to the first delay circuit and the second delay circuit, wherein the current control signal controls current drive strengths of first delay buffers in the first delay circuit and current drive strengths of second delay buffers in the second delay circuit; and holding the current control signal constant during the sweeping of the capacitive load control code.

20. The method of claim 19, wherein the first delay buffers comprise first current starved inverters and the second delay buffers comprise second current starved inverters.

* * * * *